United States Patent [19]

Steigerwald

[11] 4,295,059
[45] Oct. 13, 1981

[54] HIGH GAIN LATCHING DARLINGTON TRANSISTOR

[75] Inventor: Robert L. Steigerwald, Scotia, N.Y.

[73] Assignee: General Electric Company, Schenectady, N.Y.

[21] Appl. No.: 25,383

[22] Filed: Mar. 30, 1979

[51] Int. Cl.³ .................... H03K 17/12; H03K 17/60; H03K 17/72
[52] U.S. Cl. ............................... 307/253; 307/252 A; 307/315
[58] Field of Search .................. 307/253, 254, 252 A, 307/252 C, 305, 315; 357/51, 38

[56] References Cited
U.S. PATENT DOCUMENTS

| | | | |
|---|---|---|---|
| 3,265,909 | 8/1966 | Gentry | 307/252 C |
| 4,112,315 | 9/1978 | Ohhinata | 307/252 C |
| 4,138,690 | 2/1979 | Nawa et al. | 307/315 X |
| 4,162,413 | 7/1979 | Akamatsu | 307/253 |
| 4,188,548 | 2/1980 | Ohhinata | 307/252 C |

Primary Examiner—John Zazworsky
Attorney, Agent, or Firm—William H. Steinberg; James C. Davis, Jr.; Paul R. Webb, II

[57] ABSTRACT

A high gain latching Darlington transistor comprises a gate turn-off thyristor and a load transistor coupled in Darlington configuration. Circuit means including a diode are coupled to the gate turn-off thyristor and the transistor to provide a low loss path for load transistor current which reverse biases the gate-cathode junction of the thyristor at thyristor turn-off to prevent premature device conduction. The latching Darlington transistor configured in this manner thus operates as a conventional gate turn-off thyristor, capable of being pulsed into and out of conduction, but yet exhibits improved dv/dt capability and increased turn-off gain, typically between 10 and 100 times the turn-off gain of the individual gate turn-off thyristor.

2 Claims, 2 Drawing Figures

HIGH GAIN LATCHING DARLINGTON TRANSISTOR

BACKGROUND OF THE INVENTION

This invention relates to a semiconductor switch, and more particularly, to a latching semiconductor switch comprised of a gate turn-off thyristor and a load transistor coupled in a Darlington configuration.

Various industrial control applications often require switching of large currents. The high speed and efficiency of semiconductors make such devices desirable for such switching applications. Heretofore, discrete transistors and gate turn-off thyristors have been employed as switching devices but not without limitations on each respective device. While a conventional transistor can provide high frequency switching of moderate currents, it requires the presence of a continuous, minimum amplitude base current to remain conductive. The necessity of continuous base current for sustained transistor conduction often requires a separate DC supply which usually must be isolated from other circuitry. Darlington transistors provide additional power handling capability but do not eliminate the need for continuous base drive current in order to remain conductive.

Four-layer PNPN semiconductor switching devices of the gate turn-off thyristor type allow a semiconductor switching device to be realized which does not need a continuous base current to remain conductive. Once rendered conductive by a positive current pulse, the gate turn-off thyristor remains conductive until a negative gate current pulse is applied to turn the device off. While a gate turn-off thyristor does not require a continuous gate current to remain conductive, substantial negative gate current, typically on the order of 10 to 20 percent of the thyristor anode current, must be applied to pulse the device out of conduction. This results in the thyristor turn-off gain (the ratio of thyristor anode current to thyristor gate current at turn-off) being relatively low, which renders the thyristor unsuitable for applications where high turn-off gain is required.

It has been proposed to combine the gate turn-off thyristor and the conventional transistor in a Darlington configuration to yield a latching semiconductor switch having high turn-off gain. F. E. Gentry, in U.S. Pat. No. 3,265,909 issued on Aug. 9, 1966 and assigned to the assignee of the present invention has described and claimed such a semiconductor switch configured in a Darlington arrangement with the gate turn-off thyristor supplying base drive to the transistor.

The latching Darlington configuration of Gentry is, however, subject to the disadvantage that steeply increasing voltage transients appearing across the collector-emitter portion of the load transistor can falsely trigger the thyristor and hence the latching Darlington configuration into conduction even though the voltage transients are of a magnitude less than the breakover voltage of the gate turn-off thyristor. This phenomenon of thyristor conduction degradation due to steeply increasing voltage transients is termed the "dv/dt effect" and is more fully described on pages 221 through 222 of the text, Semiconductor Power Devices by Sorab K. Ghandi, published by John Wiley and Sons, 1977.

To improve the dv/dt capability of a latching Darlington transistor such as the type described in the aforementioned Gentry patent, I Ohhinnata, in U.S. Pat. No. 4,112,315 issued Sept. 5, 1978 provides a resistance coupled between the gate and cathode of the four layer PNPN semiconductor. This resistance serves to drop the magnitude of any transient voltage pulses appearing across the latching Darlington transistor at turn-off. Steeply increasing high voltage transients may still retrigger the Ohhinnata latching Darlington transistor into conduction, rendering such a device suitable for small signal circuit applications only.

The present invention concerns a latching semiconductor switch having high turn-off gain and increased dv/dt capability for preventing premature device conduction.

BRIEF SUMMARY OF THE INVENTION

A high gain latching Darlington transistor having increased dv/dt protection to prevent premature device conduction comprises a four layer PNPN semiconductor such as a gate turn-off thyristor coupled in Darlington configuration with a load transistor, which load transistor is adapted to conduct load current in accordance with the polarity of gating pulses applied to the gate electrode of the gate turn-off thyristor.

Circuit means are coupled to the gate turn-off thyristor and the load transistor to increase the dv/dt capability of the latching Darlington transistor by providing a low loss conduction path for load transistor currents which reverse biases the gate-cathode junction of the gate turn-off thyristor at turn-off intervals so that when steeply-increasing high voltage transients appear across the thyristor, premature thyristor conduction is prevented.

It is an object of the present invention to provide a latching semiconductor switch having high turn-off gain.

It is another object of the present invention to provide a latching semiconductor switch having increased dv/dt capability for preventing premature device conduction at turn-off when steeply increasing high voltage transients appear across the switch.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawings in which:

DETAILED DESCRIPTION OF THE PREFERRED EMBODIMENTS

Figure 1A:
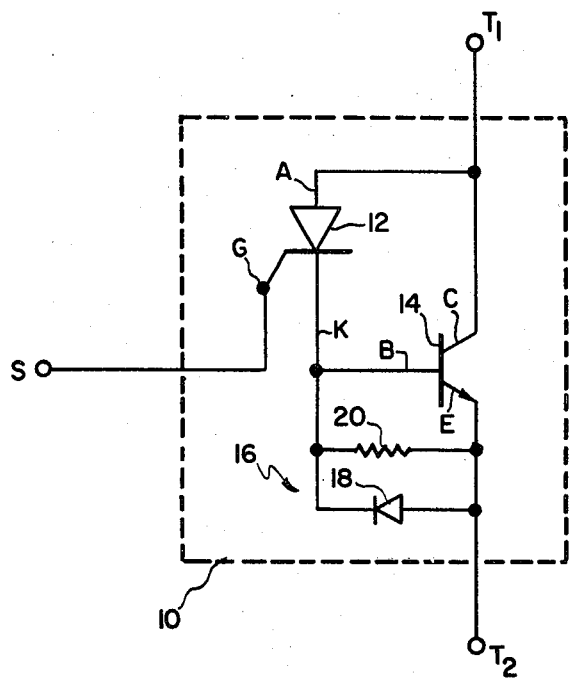
FIG. 1a is a schematic diagram of a latching semiconductor switch according to the present invention.

FIG. 1a shows a latching Darlington transistor 10 having a base, collector, and emitter electrode designated S, $T_1$, and $T_2$, respectively, which conducts substantial current between the collector-emitter portion of the device in response to the polarity of gating pulse signals applied at the base terminal S. Latching Darlington 10 comprises a four-layer, conventional PNPN semiconductor device 12 of the gate turn-off thyristor type having an anode, cathode, and gate electrode designated A, K, and G, respectively, the gate electrode G forming the base electrode S of the latching Darlington transistor. Gate turn-off thyristor 12 is rendered conductive in response to a positive gating pulse signal applied to the gate electrode G and remains conductive until a negative gating pulse signal is applied to the thyristor gate electrode G at which time current conduction through thyristor 12 is extinguished.

A load transistor, shown as NPN transistor 14, having a base, collector, and emitter electrodes designated B, C and E, respectively, is coupled in Darlington configuration to gate turn-off thyristor 12; that is, the base-collector junction of transistor 14 is coupled across the anode and cathode electrodes of gate turn-off thyristor 12. The collector-emitter portion of transistor 14 forms the collector-emitter portion of latching Darlington transistor 10.

Circuit means 16, comprised of diode 18 shunted by a resistor 20, are coupled between the emitter of transistor 14 and the cathode of gate turn-off thyristor 12, and provide a low loss conduction path for transistor 14 emitter current which reverse biases thyristor 12 at turn-off. Reverse biasing of thyristor 12 at turn-off by transistor 14 emitter current increases the thyristor dv/dt capability and thus prevents premature thyristor retriggering when steeply increasing high voltage transisents appear across thyristor 12 at turn-off.

Latching Darlington transistor 10 is rendered conductive by applying a positive gating pulse signal to the emitter electrode S, thereby rendering gate turn-off thyristor 12 conductive. Gate turn-off thyristor 12 remains conductive, supplying base current to transistor 14, which causes the same to conduct. With transistor 14 conductive, a low resistance path appears between the collector and emitter terminals $T_1$ and $T_2$ of latching Darlington transistor 10, permitting the transistor to conduct substantial load current.

To turn-off latching Darlington transistor 10, a negative gating pulse signal is applied to the base electrode S, which renders gate turn-off thyristor 12 substantially nonconductive. Consequently, transistor 14 is starved of base current, rendering it substantially nonconductive, causing a high impedance to appear between the collector and emitter electrodes $T_1$ and $T_2$ of latching Darlington transistor 10.

At turn-off, gate turn-off thyristor 12 becomes nonconductive and thus is in the blocking state prior to transistor 14 becoming nonconductive. During the interval between thyristor 12 becoming nonconductive and transistor 14 becoming nonconductive, a portion of the emitter current in transistor 14 is conducted in a substantially lossless manner by diode 18 across the cathode-gate junction of thyristor 12, causing the gate-cathode junction to be reverse-biased. Reverse biasing the gate-cathode junction of thyristor 12 causes the higher static thyristor dv/dt capability to be in effect. With the higher dv/dt capability in effect, premature thyristor conduction and hence premature latching Darlington transistor 10 conduction is prevented when steeply increasing high voltage transients appear across the collector-electrode portion of latching Darlington transistor 10 during turn-off.

Figure 1B:
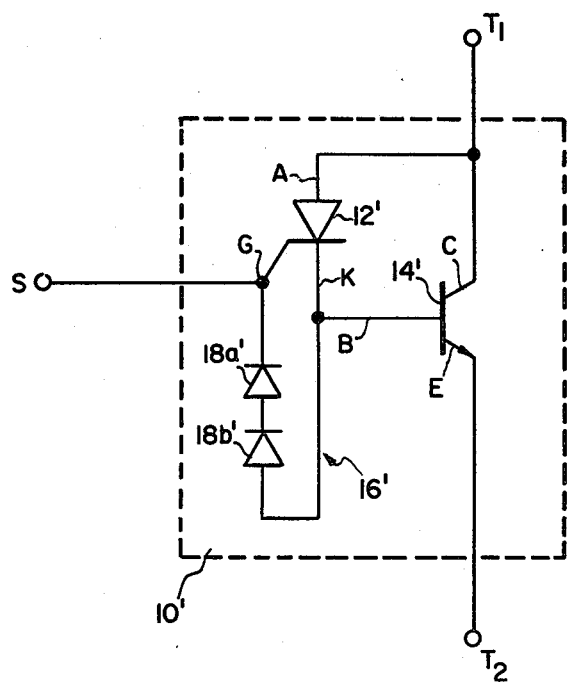
FIG. 1b is a schematic diagram of an alternative embodiment of a latching semiconductor switch according to the present invention.

Referring now to FIG. 1b, there is shown an alternative latching Darlington transistor 10' having a base, collector, and emitter electrode S, $T_1$ and $T_2$, respectively. Transistor 10' conducts substantial collector-emitter current in response to the polarity of gating pulse signals applied to the base electrode S. Latching Darlington transistor 10' comprises a four-layer, conventional PNPN semiconductor device 12' of the gate turn-off thyristor type, having a gate, cathode and anode electrode G, K and A, respectively, the thyristor gate electrode G forming the base electrode S of latching Darlington transistor 10'. Gate turn-off thyristor 12 is latched into conduction in response to a positive gating pulse signal applied to the gate electrode G and remains conductive until such time as a negative gating pulse signal is applied to the thyristor gate electrode G.

A load transistor, shown as NPN transistor 14', having a base, collector, and emitter electrode B, C and E, respectively, is coupled to gate turn-off thyristor 12' in Darlington configuration, that is, the collector and base electrodes of transistor 14', are coupled to the anode and the cathode electrodes of gate turn-off thyristor 12', respectively. The collector-emitter portion of NPN transistor 14' forms the collector-emitter portion of latching Darlington transistor 10'.

Circuit means 16' comprises two diodes 18a' and 18b' coupled in inverse series aiding fashion between the base B of transistor 14' and the gate electrode G of gate turn-off thyristor 12'. Diodes 18a' and 18b' provide a low loss path for conducting base current from transistor 14' after gate turn-off thyristor 12 has been rendered nonconductive, to increase the switching speed of transistor 14.

In operation, latching Darlington transistor 10' is rendered conductive by applying a positive gating pulse signal to the base electrode S which results in gate turn-off thyristor 12' becoming conductive.

Once rendered conductive, gate turn-off thyristor 12' remains conductive and supplies base current to transistor 14' which causes transistor 14' to become conductive. With transistor 14' conductive, a low impedance path appears between the collector and emitter electrodes $T_1$ and $T_2$, respectively, of latching Darlington transistor 10' permitting the transistor to conduct substantial current.

Latching Darlington transistor 10' is rendered nonconductive by applying a negative gating pulse signal to the base electrode S which causes gate turn-off thyristor 12' to be extinguished and transistor 14' to be starved of base current. When gate turn-off thyristor 12' is turned off, base current is withdrawn from transistor 14' via diodes 18a and 18b', causing transistor 14' to rapidly become nonconductive. When transistor 14' becomes nonconductive, a high impedance appears between the collector and emitter electrodes $T_1$ and $T_2$, respectively, of latching Darlington transistor 10'.

In addition to increasing the switching speed of transistor 14', the withdrawal of base current from transistor 14' through diodes 18a' and 18b' serves to reverse-bias the gate-cathode junction of gate turn-off thyristor 12' by approximately 2 volts. Reverse biasing of the gate-cathode junction of the gate turn-off thyristor in this manner causes the higher static dv/dt capability of the thyristor to be in effect. This prevents premature thyristor conduction in the event steeply increasing high voltage transients appears across the collector-emitter portion of latching Darlington transistor 10' after gate turn-off thyristor 12' has been rendered nonconductive.

Both latching Darlington transistor 10 and 10' of FIGS. 1a and 1b, respectively, exhibit high turn-off gain, typically in the range of 100 to 200. The forward voltage drop of latching Darlington transistors 10 and 10' is comparable to that of a higher voltage (>400 volts) conventional Darlington transistor since the voltage drop of each of gate turn-off thyristors 12 and 12', respectively, is comparable to that of a typical high voltage transistor. Each latching Darlington transistor can be fabricated in a single package or in monolithic form.

The foregoing describes a latching Darlington transistor having high turn-off gain and increased dv/dt capability. Increased dv/dt capability is provided by reverse-biasing the thyristor gate-cathode junction with load transistor current at thyristor turn-off to prevent premature thyristor re-triggering in the event steeply increasing voltage transients appear across the thyristor at turn-off.

While only certain preferred features of the invention have been shown by way of illustration, many modifications and changes will occur to those skilled in the art. For example, a latching Darlington transistor could also be configured of a complementary gate turn-off thyristor and PNP load transistor in place of the conventional gate turn-off thyristor and NPN transistor. It is, therefore, to be understood that the appended claims are intended to cover all such modifications and changes as fall within the true spirit of the invention.

What is claimed is:

1. A high gain latching Darlington transistor having increased dv/dt capability comprising:

(a) a four-layer PNPN semiconductor switching device having a gate, a cathode, and an anode electrode, said four-layer PNPN semiconductor switching device conducting current through the anode-cathode portion thereof in accordance with the polarity of the gating pulse signals applied to said gate electrode;

(b) a load transistor having a base, a collector, and an emitter electrode, said load transistor coupled in Darlington configuration to said four-layer PNPN semiconductor switching device, said load transistor conducting substantial load current through the collector-emitter portion thereof in response to current conduction through said four-layer PNPN semiconductor switching device; and (c) first and second diodes coupled in inverse series aiding fashion between the gate electrode of said 4-layer PNPN semiconductor and the junction of said 4-layer PNPN semiconductor and said load transistor base electrode.

2. The invention according to claim 1 wherein said four-layer PNPN semiconductor switching device comprises a conventional gate turn-off thyristor and said load transistor comprises an NPN transistor.

* * * * *